United States Patent
Hetzler (10) Patent No.: US 8,598,976 B2
(45) Date of Patent: Dec. 3, 2013

(54) ELECTRONIC COMPONENT AND CORRESPONDING PRODUCTION METHOD

(75) Inventor: Ullrich Hetzler, Dillenburg-Oberscheld (DE)

(73) Assignee: Isabellenhütte Heusler GmbH & Co. KG, Dillenburg (DE)

(*) Notice: Subject to any disclaimer, the term of this patent is extended or adjusted under 35 U.S.C. 154(b) by 0 days.

(21) Appl. No.: 13/381,783

(22) PCT Filed: Jun. 16, 2010

(86) PCT No.: PCT/EP2010/003621
§ 371 (c)(1),
(2), (4) Date: Mar. 7, 2012

(87) PCT Pub. No.: WO2010/121841
PCT Pub. Date: Oct. 28, 2010

(65) Prior Publication Data
US 2012/0154104 A1    Jun. 21, 2012

(30) Foreign Application Priority Data
Jul. 1, 2009 (DE) .................. 10 2009 031 408

(51) Int. Cl.
*H01C 7/00* (2006.01)
(52) U.S. Cl.
USPC .................... 338/49; 338/322; 338/334
(58) Field of Classification Search
USPC .................................................... 338/49
See application file for complete search history.

(56) References Cited

U.S. PATENT DOCUMENTS

| | | | | |
|---|---|---|---|---|
| 3,252,091 A * | 5/1966 | Morgan | ........ | 324/126 |
| 4,580,095 A * | 4/1986 | DeVries | ........ | 324/126 |
| 5,214,407 A * | 5/1993 | McKim et al. | ........ | 338/49 |
| 5,896,077 A * | 4/1999 | Cadwallader | ........ | 336/192 |
| 6,304,062 B1 * | 10/2001 | Batson | ........ | 320/134 |
| 6,489,693 B1 | 12/2002 | Hetzler | | |
| 6,946,845 B2 | 9/2005 | Hetzler | | |
| 7,170,295 B2 | 1/2007 | Hetzler | | |
| 2003/0222511 A1 | 12/2003 | Hetzler | | |
| 2004/0263150 A1 | 12/2004 | Hetzler | | |
| 2010/0066351 A1 | 3/2010 | Condamin et al. | | |
| 2011/0062945 A1 | 3/2011 | Condamin et al. | | |

FOREIGN PATENT DOCUMENTS

| | | |
|---|---|---|
| DE | 2428791 A1 | 1/1976 |
| DE | 2939594 A1 | 4/1981 |
| DE | 4339835 A1 | 6/1995 |
| EP | 0605800 A1 | 7/1994 |
| EP | 1030185 A2 | 11/2002 |
| EP | 1363131 A1 | 11/2003 |
| EP | 1492130 A2 | 12/2004 |
| EP | 1901314 A1 | 3/2008 |
| FR | 2879751 A1 | 6/2006 |
| WO | 2006/067300 A1 | 6/2006 |

* cited by examiner

*Primary Examiner* — Kyung Lee
(74) *Attorney, Agent, or Firm* — Erickson Law Group, PC (57) ABSTRACT

The invention relates to an electronic component (1), in particular a low-ohm current-sense resistor, comprising at least one plate-shaped section (2, 3) and at least one terminal (7, 8) to electrically contact the plate-shaped section (2, 3). According to the invention, the terminals (7, 8) for measuring the voltage drop created by the current flow are formed by means of stamping and thread-shaping in the plate-shaped sections (2, 3).

26 Claims, 6 Drawing Sheets

ELECTRONIC COMPONENT AND CORRESPONDING PRODUCTION METHOD

TECHNICAL FIELD

The invention relates to an electronic component, in particular a low-ohm current-sense resistor, as well as a corresponding production method.

BACKGROUND OF THE INVENTION

From EP 0 605 800 A1 a low-ohm current-sense resistor is known that can be used, for example, in a motor vehicle on-board electrical system in order to measure the battery current within the framework of a battery management system. Here, the battery current to be measured is conducted by the low-ohm current-sense resistor, wherein the electric voltage drop over the current-sense resistor and which corresponds to the measured battery current according to Ohm's law will be measured according to the known four-wire technology. The current-sense resistor here consists of two plate-shaped connecting parts made of a conducting material (e.g. copper) and a resistor element, which is also plate-shaped and is made of a resistor material. (e.g. CuMnNi), wherein the resistor element, is inserted between the two connecting parts and is electron-beam welded to the two connecting parts. For the supply or discharging of the battery current to be measured, this document discloses screws, which are attached to the two connecting parts.

Additionally, other designs of connecting contacts are known from the prior art for this kind of low-ohm current-sense resistors, such as, for example, externally-placed solder terminations, internally-placed solder terminations, AMP flat plugs, insert nuts, welded-on connecting contacts, soldered litz wires or soldered-on circuit boards. These known designs of connecting contacts for low-ohm current-sense resistors are, however, actually intended for other fields of application and are not optimally suited to the contacting of current-sense resistors due to the high electric currents. The previously mentioned insert nuts, however, come very close to the required mounting technology and have, in comparison to external voltage sensing connections, minimal material consumption; however, these kinds of insert nuts are expensive to manufacture and have the disadvantage that thermoelectric voltages, which occur in the insert nuts could considerably falsify the voltage measurement.

From DE 24 28 791 A1 a series resistor for motor vehicles is known, wherein the actual series resistor is connected to a terminal element, in which a plate eyelet, with a thread is provided. The electrical contacting occurs here by a screw being screwed into the thread of the plate eyelet. Accordingly, this document relates to a completely different type of resistor than the invention.

Furthermore, with respect to the prior art, reference is to be made to FR 2 879 751 A1, EP 1 030 185 A2, EP 1 363 131 A1 and DE 433 98 35 A1.

SUMMARY OF THE INVENTION

The object of the invention is therefore to create a current-sense resistor in which the connecting contacts are optimized. It is in particular desirable to enable an electric contacting of the connecting parts for measuring voltage, wherein the contacting exhibits a minor material usage, as far as possible does not generate any thermoelectric voltage and is optimized in its manufacturing process and also according to costs.

This object is achieved by means of an electronic component according to the invention and a corresponding manufacturing process according to the accessory claims.

The invention comprises the general technical teaching of forming a connecting contact in an electronic component. (e.g. a low-ohm current-sense resistor) by an embossment in a plate-shaped section of the component. These kinds of embossments are also known from DE 43 39 835 A1; however these kinds of embossments were not yet used in the formation of electric connecting contacts, as it is envisioned for the first time by the invention.

The electronic component according to the invention exhibits at least one plate-shaped section (e.g. a connecting part), in which the embossment for the connecting contact is formed.

The embossment preferably exhibits a through-hole in the plate-shaped section, i.e. an opening from one side of the plate-shaped section to the opposite side of the plate-shaped section.

Additionally, the embossment or the opening in the plate-shaped section preferably exhibits a thread in order to accommodate a fastening screw, with which, for example, a cable shoe can be fastened by being screwed into the connecting contact. The thread is preferably an internal thread that preferably exhibits at least 3, 4, 5 or at least 6 thread turns to safely accommodate the fastening screw. In addition, it must be mentioned in relation to the thread that it is preferably a metric thread as opposed to a thread for a sheet-metal screw.

In the preferred exemplary embodiment, the embossment of the plate-shaped section protrudes collar-shaped to one side. The embossment can also be produced by collar forming, for example, according to DIN 8580. The invention is, however, not limited to collar forming with regard to the deformation process used to produce the embossment, but can also be realized with other deformation processes.

In the preferred exemplary embodiment of the invention, the component exhibits several (e.g. two) (voltage-) connecting contacts that are formed by an embossment.

It should also be mentioned that the invention is not restricted to specific types of electronic components. For example, the electric component according to the invention can also be a passive, discrete, linear and/or bipolar component. Additionally, the component according to the invention can be suited for surface mounting, so that in is a SMD component (SMD: Surface Mounted Device). However, the component according to the invention is preferably a resistor, particularly a fixed resistor and specially a low-ohm current-sense resistor.

The current-sense resistor according to the invention preferably exhibits two plate-shaped connecting parts made of a low-ohm conductor material (e.g. copper), as it is known from the document EP 0 605 800 A1 already mentioned above. Additionally, the current-sense resistor according to the invention preferably exhibits a plate-shaped resistor element that is switched between the two connecting parts and consists of a low-ohm resistor material (e.g. CuMnNi) that exhibits a bigger specific resistance than the conductor material of the connecting parts. In addition, the current-sense resistor according to the invention also has two connecting contacts for electric contacting (power input) of the two plate-shaped connecting parts and for the measurement of the electric voltage drop over the resistor element, wherein the two connecting contacts for the voltage measurement are each formed by an embossment in the corresponding plate-shaped connecting part.

It should be mentioned here that in the concept used within the framework the invention, a plate-shaped connecting part or resistance element is to be understood generally and is not limited in that the connecting parts or the resistor element are even. There is also furthermore the possibility that the plate-shaped connecting parts and/or the plate-shaped resistor element are bent. It is solely decisive that the plate-shaped connecting parts or the plate-shaped resistor element can be produced from a band material, so that the connecting parts and the resistor element are relatively thin in relation to the lateral expansion and exhibit parallel upper and under sides.

Besides the previously mentioned connecting contacts for voltage measurement, the current-sense resistor according to the invention also preferably exhibits at least two connecting contacts for the supplying or discharging of the electric current to be measured. For example, these connecting contacts for the voltage to be measured can consist of circular holes in the two connecting parts, in which hole screws can be inserted. However, alternatively there is also the possibility that the connecting contacts for the electric current consist of the screws which were already mentioned in the above concerning the prior art, as they are described in EP 0 605 800 A1. However, the invention is not limited to the two previously described examples with respect to the design of the connecting contacts for the electric current, but also encompasses other designs of connecting contacts.

The resistor material of the low-ohm resistor element can be, for example, a copper alloy, in particular a copper-manganese alloy, such as, for example, CuMn7Sn, CuMn3 or CuMn12Ni. However, there is also alternatively the possibility that a copper-nickel alloy is used as the resistor material, such as, for example, CuNi15, CuNi10, CuNi6, CuNi44, CuNi12 or CuNi1. Additionally, within the framework of the invention there is the possibility that the resistor material is a copper-nickel-manganese alloy, such as, for example, CuNi23Mn or CuNi30Mn. However, the resistor material can also be a nickel, alloy, such as, for example, a nickel-chrome alloy, such as, for example, NiCr6015, NiCr20AlSi, NiCr8020 or NiCr3020. In addition, there is the possibility that the resistor material is a nickel-copper alloy, such as, for example, NiCu30Fe. A further example for a possible resistor material is nickel, in particular Ni99.2, Ni99.6 or Ni99.98. In addition the resistor material can also be a nickel-iron alloy or an iron-chrome alloy, such as, for example, Ni—Fe30 or Ni99.4Fe or FeCr10Al (Aluchrome). Finally, copper can also be applied as a resistor material, particularly what is known as E-copper, which is also designated as Cu-ETP.

Copper or a copper alloy is preferably applied as the conductor material for the connecting parts. However, the fact that the connecting parts consist of a material with a greater specific conductibility is decisive for the use in a current-sense resistor.

With respect to the design of the current-sense resistor according to the invention, there are various possibilities.

In one variant the resistor element, is located between the two connecting parts, so that both connecting parts are connected to the opposite side edges of the resistor element.

This design enables manufacture from what is known as a tri-band, that consists of an elongated band made of the resistor material, that is welded on both sides with, in each case, a band made of the conductor material and therefore consists of three bands that are welded to one another.

In another variant of the invention, however, both connecting parts are spaced from one another on the same side of the resistor element and connected to a shared side edge of the resistor element. This variant enables the production from a composite material band, in which only one band made of the resistor material is welded with a band from the conductor material.

The invention is not restricted to the previously described component according to the invention as a single part. The invention rather also comprises a battery management module for the monitoring of a battery, in particular in a motor vehicle on-board electrical system. The battery management module according to the invention also contains, besides the low-ohm current-sense resistor described above, an electronic evaluation unit, which measures the voltage drop over the current-sense resistor between the two voltage measuring connections formed according to the invention, wherein the evaluation unit is mechanically connected to the current-sense resistor.

Examples for such battery management modules are known from EP 1 030 185 A2, so that the content of this document can be fully reckoned to the present description with respect to the design and the functioning method of the battery management module.

The invention further generally comprises a voltage measuring module, which, besides the low-ohm current-sense resistor described above, also contains an electronic evaluation unit which measures the voltage drop over the current-sense resistor between the two voltage measuring connections formed according to the invention, wherein the evaluation unit is mechanically connected to the current-sense resistor. These kinds of voltage measuring modules can be used in many ways, for example in solar technology, drive technology or in power supply technology.

The integrated evaluation unit can be, for example, an ASIC (Application Specific Integrated Circuit), as it is known for example from EP 1 363 131 A1, so that also the contents of this document can be fully reckoned with respect to the design and the mode of operation of an ASIC of the present description.

In addition, the invention also comprises a production method for an electronic component according to the invention, in which a connecting contact is formed by an embossment in the plate-shaped section.

In the production of the embossment, preferably, a through-hole is created in the plate-shaped section and a thread is applied to the embossment in order to accommodate a screw.

In the preferred exemplary embodiment the formation of the embossment, the introduction of the through-hole and/or the application of the thread are carried out in one single production step by the same machine.

Preferably, the embossment is produced by the deformation process that is designated as flow drilling, that is per se known from the prior art. Suitable tools for flow drilling are for example obtainable from the German company Flowdrill GmbH and can be used in stamping and bending machines which are customary in the trade.

It should also be mentioned that the component according to the invention is preferably produced from a composite material band, as it is described in detail in EP 0 605 800 A1, so that the content of this document can be fully reckoned with regard to the production of the component according to the invention.

Other advantageous developments are characterized in the dependent claims or will be explained in more detail below together with the description of the preferred exemplary embodiments of the invention, with reference to the figures. The figures show as follows:

DETAILED DESCRIPTION

Figure 1A:
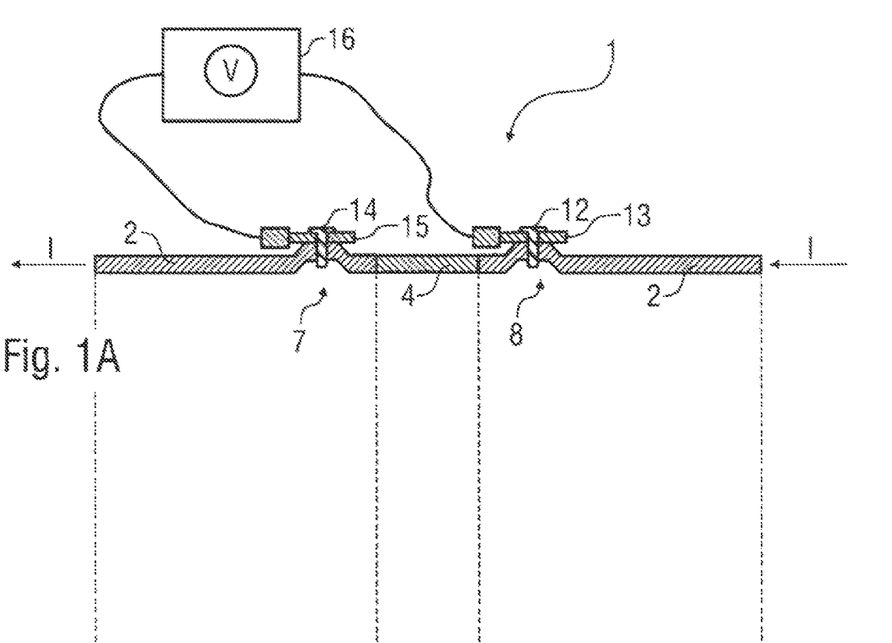
FIG. 1A a cross-sectional view of a current-sense resistor according to the invention, FIG. 1B a view of the current-sense resistor according to FIG. 1A, FIG. 1C an enlarged cross-sectional view through the embossment in the current-sense resistor according to FIGS. 1A and 1B, FIG. 2A a view of a possible constructive form of the current-sense resistor, FIG. 2B a view of an alternatively possible constructive form of the current-sense resistor, FIG. 3 a cross-sectional view through a battery management module with the current-sense resistor according to the FIGS. 1A-1C and an ASIC with an A/D converter and an integrated signal processing application, FIG. 4 a simplified circuit diagram as an illustration of the use of the voltage-measuring module according to FIG. 3 in a motor vehicle on-board electrical system, FIG. 5A the production method according to the invention in the form of a flow chart, FIG. 5B a composite material band and a current-sense resistor separated out therefrom according to FIG. 5A, FIG. 6A a variant of the production method according to the invention in the form of a flow chart, as well as FIG. 6B a composite material band and a current-sense resistor separated out therefrom according to FIG. 6A and FIG. 2.
Figure 1B:
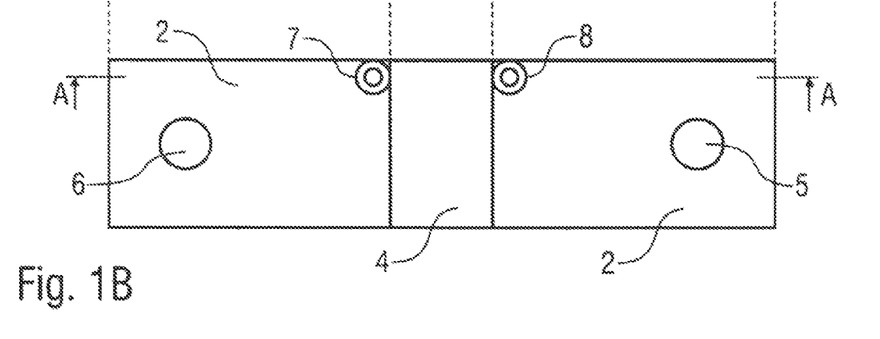
Figure 1C:
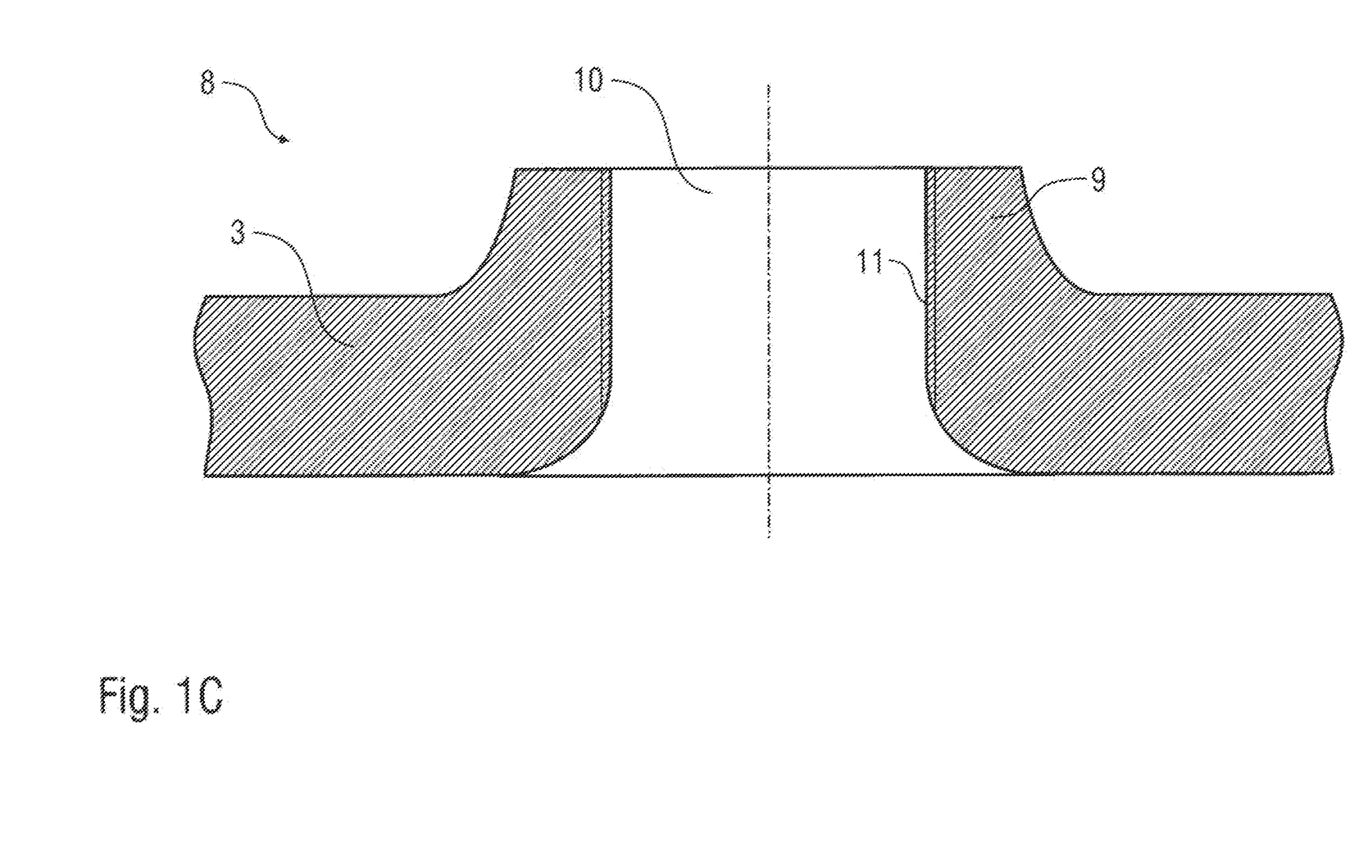

The FIGS. 1A-1C show a current-sense resistor 1 according to the invention that can, for example, be used in a motor vehicle on-board electrical system, in order to measure a battery current I.

The current-sense resistor 1 consists essentially of two plate-shaped connecting parts 2, 3 made of copper and a resistor element 4, which is also plate-shaped and is made or a copper-manganese-nickel alloy (e.g. Manganin®), wherein the resistor element 4 is inserted between the two connecting parts 2, 3 and is electron-beam welded to the two connecting darts 2, 3.

For the supply or discharging of the battery current I to be measured, the current-sense resistor 1 exhibits two conventional connecting contacts 5, 6 that consist in this exemplary embodiment in each case of one circular hole in both connecting parts 2, 3.

In addition, the current-sense resistor 1 exhibits for voltage measurement two connecting contacts 7, 8 that are formed in a novel way and each consist of one embossment in the plate-shaped connecting parts 2, 3.

From the enlarged cross-sectional view in FIG. 1C it is visible that the connecting contact 8 exhibits one collar 9 protruding from the plate-shaped connecting part 3, which collar encompasses a through-hole 10, wherein the through-hole 10 forms a threaded through-hole with a metric internal thread 11. A fastening screw 12 can be screwed in in the internal thread 11 in order to, for example, fasten a cable shoe 13 to the connecting contact 8.

In the same way a fastening screw 14 can be screwed down on the connecting contact 7 in order to fasten a cable shoe 15 onto the connecting contact 7.

During operation, a voltage measuring device 16, that is only schematically represented here, measures the electric voltage that occurs between the two connecting contacts 7, 8 and therefore over the resistor element 4, wherein the measured electric voltage is proportional to the battery current I according to Ohm's Law.

Figure 2A:
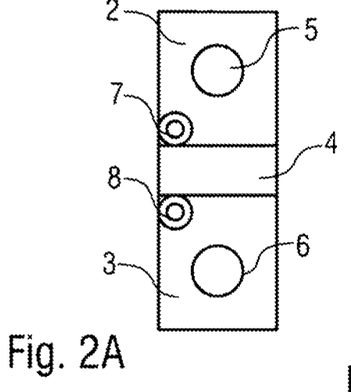
Figure 2B:
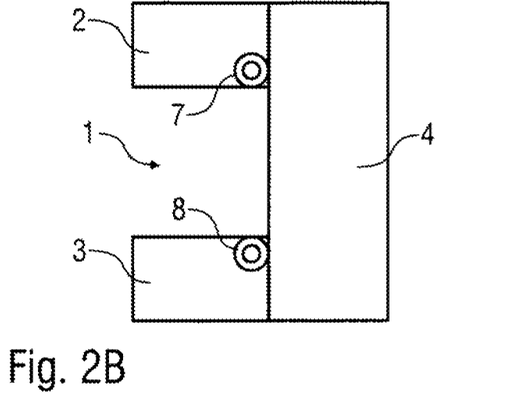

FIG. 2B shows an alternatively possible design of the current-sense resistor 1, wherein this design partially corresponds to the design which is described above and is represented in the FIGS. 1A-1C, so that in order to avoid repetition, reference is made to the above description with the same reference numbers being used for corresponding details.

A particularity of this variant consists in that both connecting parts 2, 3 are welded on the same side of the resistor element 4 on the resistor element 4.

Figure 3:
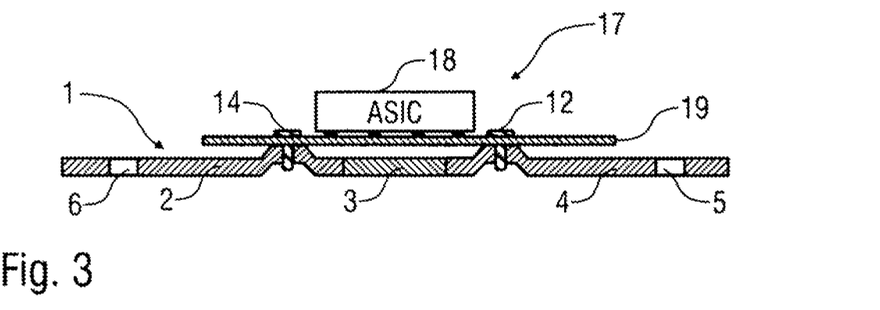

FIG. 3 shows a complete battery management module 17 that consists essentially of the current-sense resistor 1 according to the FIGS. 1A-1C and an ASIC 18, wherein the ASIC 18 is described as an example in EP 1 363 131 A1 and that measures the electric voltage decreasing over the resistor element 4 of the current-sense resistor 1. The ASIC 18 is mechanically and electrically connected to the current-sense resistor 1 by means of a circuit board 19.

Figure 4:
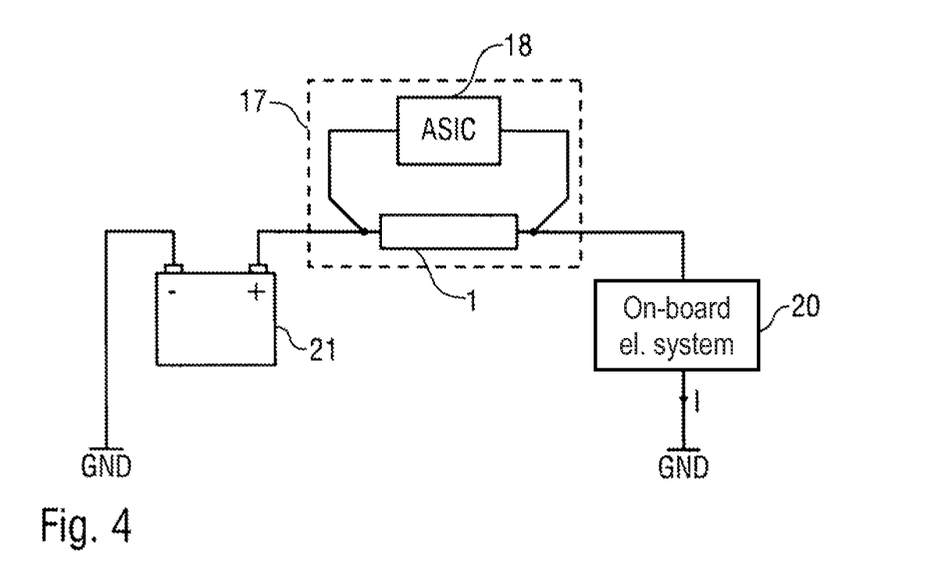

FIG. 4 shows a simplified circuit diagram for the use of the battery management module 17 according to FIG. 3 for the measurement of the battery voltage I in a motor vehicle on-board electrical system 20, which contains several loads and is supplied by a battery 21. For the purpose of simplification, the generator used to charge the battery 21 is here not represented.

Figure 5A:
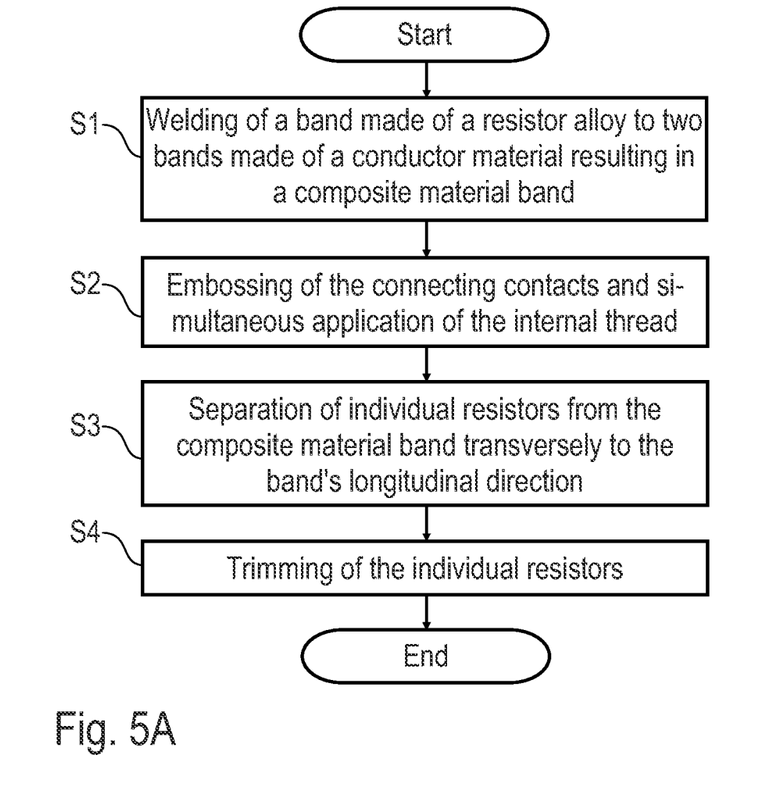
Figure 5B:
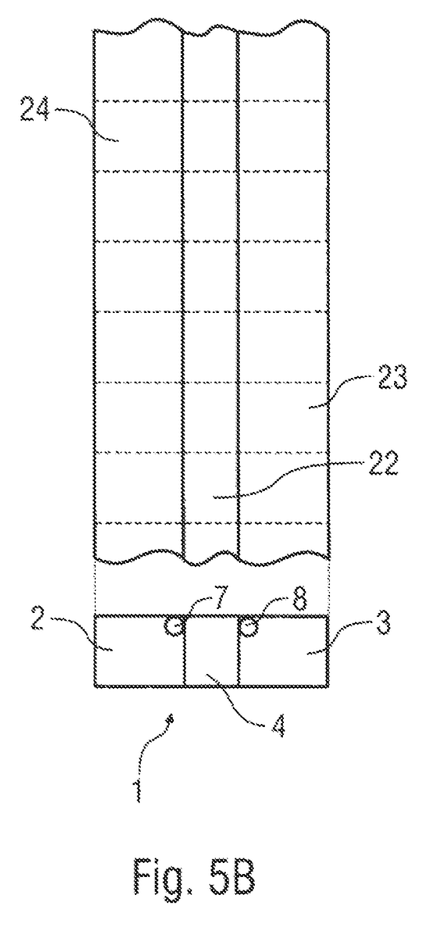

FIGS. 5A and 5B illustrate the production of the current-sense resistor according to the invention as in FIGS. 1A-1C.

In a first step S1, a band 22 is first electron-beam welded on both sides with a band 23 or 24, respectively, made of the resistor material.

Then, in a further step S2, the connecting contacts 7, 8 are embossed, wherein the internal thread 11 is applied at the same time.

In a next step S3 the individual current-sense resistors 1 are then separated from the composite material.

Finally the individual current-sense resistors 1 are then trimmed to the desired value of resistance in a step S4.

Figure 6A:
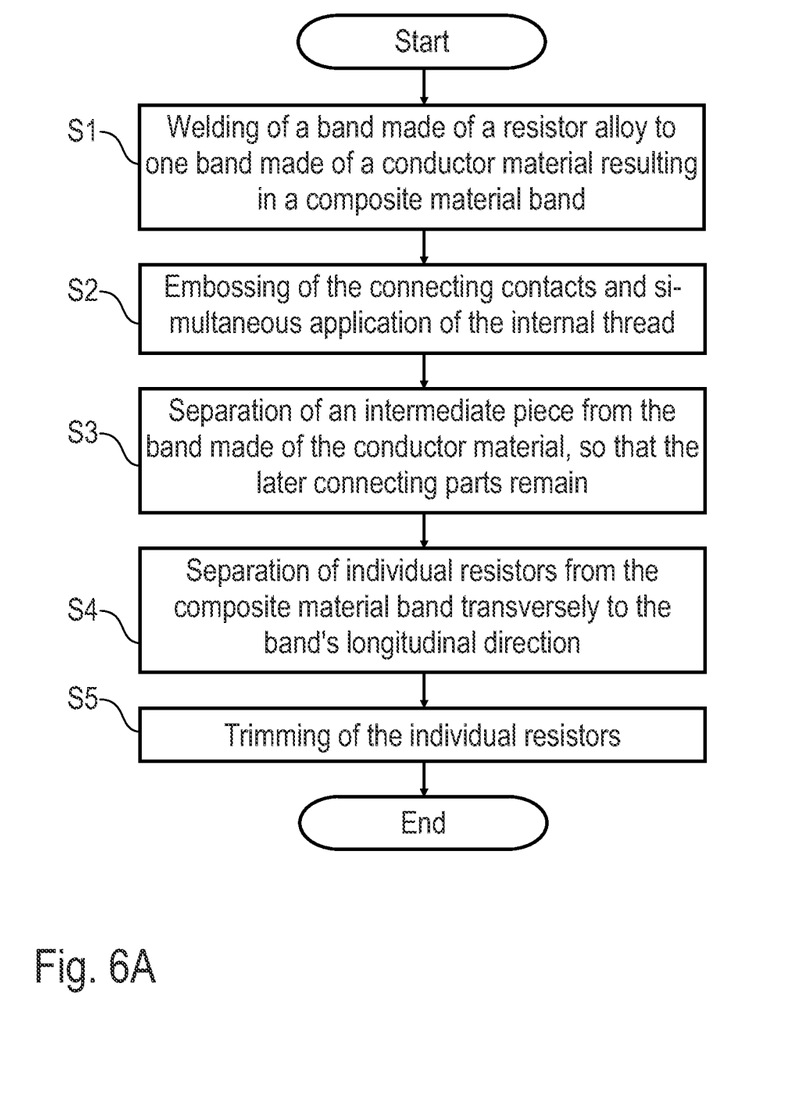
Figure 6B:
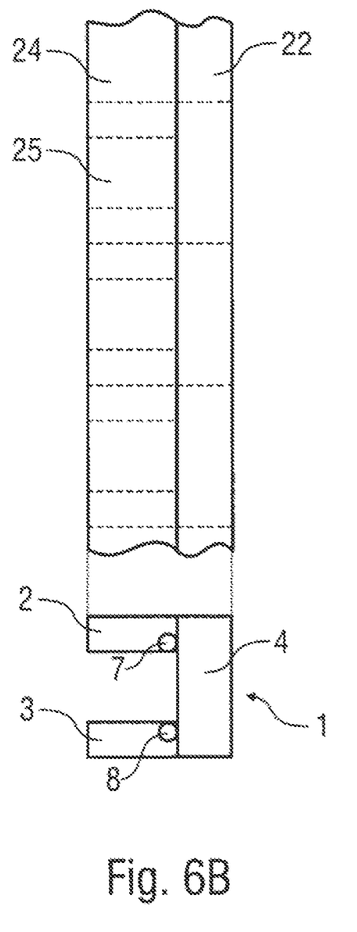

FIGS. 6A and 6B show the production method for the production of the current-sense resistor 1 according to FIG. 2.

Here, in a first step S1, the band 22 made of the resistor material is first electron-beam welded with the band 24 made of the conductor material. As opposed to the production method according to FIGS. 5A and 5B the resulting composite material band here consists thus of only two bands that are welded to one another.

In a further step S2, the connecting contacts 7, 8 are again embossed, wherein the internal thread 11 is again applied at the same time.

In a next step S3, intermediate pieces 25 made of the composite material band are then separated out, so that only the later connecting parts 2, 3 remain.

Finally, in a step S4, the individual current-sense resistors 1 are then separated from the composite material band.

Finally, in a step S5, a trimming of the individual, current-sense resistors then occurs.

The invention is not limited to the preferred exemplary embodiments described above. Instead, many variants and modifications are possible, which also make use of the concept of the invention and thus fall within the scope of protection.

LIST OF REFERENCE NUMERALS

1 Current-sense resistor
2 Connecting part
3 Connecting part
4 Resistor element
5 Connecting contact
6 Connecting contact
7 Connecting contact 8 Connecting contact
9 Collar
10 Through-hole
11 Internal thread
12 Fixing screw
13 Cable shoe
14 Fixing screw
15 Cable shoe
16 Voltage measuring device
17 Battery management module
18 ASIC
19 Circuit board
20 Motor vehicle on-board electrical system
21 Battery
22 Band made of resistor alloy
23 Band made of conductor material
24 Band made of conductor material
25 Intermediate pieces
I Battery current

The invention claimed is:

1. An electronic component comprising:
 a) at least one plate-shaped section and
 b) at least one connecting contact for electric contacting of the plate-shaped section,
 c) wherein the connecting contact is formed by an embossment in the plate-shaped section, wherein the embossment exhibits a thread in order to accommodate a screw.

2. The electronic component according to claim 1, wherein the thread is an internal thread, and
the thread exhibits at least 5 thread turns.

3. Electronic component according to claim 1, wherein the embossment of the plate-shaped section protrudes to one side.

4. An electronic component in the form of an electric current sense resistor, comprising:
 a) two plate-shaped connecting parts made of a low-ohm conductor material,
 b) a plate-shaped resistor element that is coupled electrically between the two connecting parts and consists of a resistor material that exhibits a greater specific resistance than the conductor material of the connecting parts, and
 c) two connecting contacts for electric contacting of the two plate-shaped connecting parts and for measuring the electric voltage that drops over the resistor element, wherein the two connecting contacts are each formed by an embossment in the respective plate-shaped section.

5. The electronic component according to claim 4, wherein two connecting contacts are provided on the two connecting parts for the supply or discharging of an electric current to be measured.

6. The electronic component according to claim 4, wherein the resistor material is selected from a group consisting of:
 a) high-ohmic material and low-ohmic material,
 b) a copper alloy, a copper-manganese alloy, CuMn7Sn, CuMn3, CuMn12Ni, a copper-nickel alloy, CuNi15, CuNi10, CuNi6, CuNi44, CuNi2, CuNi1, a copper-nickel-manganese alloy, CuNi23Mn, CuNi30Mn,
 c) a nickel alloy, a nickel-chrome alloy, in particular NiCr6015, NiCr20AlSi, NiCr8020, NiCr3020, a nickel-copper alloy, NiCu30Fe,
 d) nickel, Ni99.2, Ni99.6, Ni99.98,
 e) a nickel-iron alloy, NiFe30, Ni99.4Fe,
 f) an iron-chrome alloy, FeCr25Al5.

7. The electronic component according to claim 4, wherein the conductor material is selected from a group consisting of copper, a copper alloy and aluminum.

8. The electronic component according to claim 4 wherein the resistor element is inserted between the two connecting parts, so that the two connecting parts are connected to the opposite side edges of the resistor element.

9. The electronic component according to claim 4, wherein the two connecting parts on the same side of the resistor element are spaced from one another and connected to a shared side edge of the resistor element.

10. The electronic component according to claim 1, wherein the electronic component is selected from a group consisting of:
 a) a passive component,
 b) a discrete component,
 c) a linear component,
 d) a bipolar component,
 e) a SMD component,
 f) a resistor,
 g) a fixed resistor,
 h) a low-ohm current-sense resistor.

11. Current measuring module for the monitoring of a current with
 a) a current-sense resistor according to claim 1, wherein the current-sense resistor is connected in series during operation to the load and measures the consumption current, and
 b) an electronic evaluation unit, which measures the electric voltage that drops over the current-sense resistor between the two connecting contacts, wherein the evaluation unit is mechanically connected to the current-sense resistor.

12. Battery management module according to claim 11 for the monitoring of a battery.

13. Production method for an electronic component comprising the following steps:
 a) Provision of at least one plate-shaped section of the component,
 b) Forming of a connecting contact on the plate-shaped section for electric contacting of the plate-shaped section,
 c) wherein the connecting contact is formed by an embossment in the plate-shaped section, further comprising the following additional step:
 creation of a through-hole in the plate-shaped section by the embossment of the connecting contact.

14. Production method for an electronic component comprising the following steps:
 a) Provision of at least one plate-shaped section of the component,
 b) Forming of a connecting contact on the plate-shaped section for electric contacting of the plate-shaped section,
 c) wherein the connecting contact is formed by an embossment in the plate-shaped section, further comprising the following step:
 applying a thread in the embossment in order to accommodate a screw.

15. The production method according to claim 14, comprising the step of creation of a through-hole in the plate-shaped section by the embossment of the connecting contact, wherein at least one of the embossment, the through-hole and the thread is created in a single production step by the same machine.

16. Production method according to claim 14, wherein
 a) the thread is an internal thread, and
 b) the thread exhibits at least 5 thread turns.

17. Production method for an electronic component comprising the following steps:

a) provision of a resistor with two plate-shaped connecting parts made of a conductor material and a plate-shaped resistor element made of a resistor material, wherein the resistor element is coupled electrically between the connecting parts and is electrically and mechanically connected to the connecting parts, b) embossment of one connecting contact, respectively, in both plate-shaped sections for electric contacting of the plate-shaped connecting parts.

18. The production method according to claim 17, further comprising the following steps for provision of the resistor a) provision of one elongated band made of the resistor material, b) provision of at least one elongated band made of the conductor material, c) welding of the band made of the resistor material to the band made of the conductor material in the longitudinal direction of the band, so that a composite material band is generated, d) separation of the resistor from the composite material band transversely to the longitudinal direction of the band.

19. The production method according to claim 18, wherein the band made of the resistor material is welded on each of its longitudinal edges to a band made of the conductor material resulting in the composite material band.

20. The production method according to claim 18, wherein the band made of the resistor material is welded to one single band made of the conductor material resulting in the composite material band.

21. The production method according to claim 20, further comprising the following step after welding: separation of sections of the composite material band, wherein the sections extend over the whole width of the band made of the conductor material.

22. Production method for an electronic component comprising the following steps:

a) Provision of at least one plate-shaped section of the component, b) Forming of a connecting contact on the plate-shaped section for electric contacting of the plate-shaped section, c) wherein the connecting contact is formed by an embossment in the plate-shaped section, wherein the embossment is formed by collar forming.

23. The electronic component according to claim 1, wherein the electronic component is a low-ohm current sense resistor.

24. The electronic component according to claim 1, wherein the embossment contains a through-hole in the plate-shaped section.

25. The electronic component according to claim 24, wherein the thread is exhibited in the through-hole.

26. The electronic component according to claim 25, wherein the thread exhibits at least 5 thread turns.

* * * * *